US010770812B2

United States Patent
Hagiwara

(10) Patent No.: US 10,770,812 B2
(45) Date of Patent: Sep. 8, 2020

(54) CONNECTION TERMINAL ASSEMBLED BODY AND CIRCUIT BOARD USING SAME CONNECTION TERMINAL ASSEMBLED BODY

(71) Applicant: HITACHI AUTOMOTIVE SYSTEMS, LTD., Hitachinaka-shi, Ibaraki (JP)

(72) Inventor: Katsumasa Hagiwara, Isesaki (JP)

(73) Assignee: HITACHI AUTOMOTIVE SYSTEMS, LTD., Hitachinaka-Shi (JP)

( * ) Notice: Subject to any disclaimer, the term of this patent is extended or adjusted under 35 U.S.C. 154(b) by 0 days.

(21) Appl. No.: 16/329,749

(22) PCT Filed: Aug. 9, 2017

(86) PCT No.: PCT/JP2017/028877
§ 371 (c)(1),
(2) Date: Feb. 28, 2019

(87) PCT Pub. No.: WO2018/061490
PCT Pub. Date: Apr. 5, 2018

(65) Prior Publication Data
US 2019/0221952 A1    Jul. 18, 2019

(30) Foreign Application Priority Data

Sep. 29, 2016 (JP) .................................. 2016-190826

(51) Int. Cl.
*H01R 12/57*  (2011.01)
*H01L 23/50*  (2006.01)
(Continued)

(52) U.S. Cl.
CPC ....... *H01R 12/57* (2013.01); *H01L 23/49517* (2013.01); *H01L 23/49541* (2013.01);
(Continued)

(58) Field of Classification Search
CPC ........ H01R 12/52; H01R 12/57; H01R 43/20; H01L 23/49517; H01L 23/49541; H01L 23/50; H05K 1/14; H05K 2201/10757
See application file for complete search history.

(56) References Cited

U.S. PATENT DOCUMENTS 3,864,014 A * 2/1975 Lynch .................... H01R 12/58
                                                                439/389
4,992,057 A * 2/1991 Smit ...................... H01R 13/41
                                                                439/83

(Continued)

FOREIGN PATENT DOCUMENTS

JP    2012-156009 A    8/2012
JP    2015-060958 A    3/2015

*Primary Examiner* — Oscar C Jimenez
(74) *Attorney, Agent, or Firm* — Foley & Lardner LLP

(57) ABSTRACT

A unit connection terminal (26) is formed of an adhesion section (29) to be soldered onto a circuit board (21) and extending in a longitudinal direction, a terminal section (30) extending in the direction approximately orthogonal to the adhesion section extending in the longitudinal direction and to be connected to a counterpart-side circuit board, a bent section (31) bent so as to connect the adhesion section and the terminal section, and of a suction member (28) made of synthetic resin, fixed more to the terminal side than the bent section (31), and having a suction surface. More preferably, a projection position where the gravity center position of the entire unit connection terminal is projected toward the adhesion section side is included in the adhesion range of the adhesion section.

9 Claims, 16 Drawing Sheets

(51) Int. Cl.
   *H01L 23/495*      (2006.01)
   *H01R 43/20*       (2006.01)
   *H01R 12/52*       (2011.01)
   *H05K 1/14*        (2006.01)

(52) U.S. Cl.
   CPC ............ *H01L 23/50* (2013.01); *H01R 12/52* (2013.01); *H01R 43/20* (2013.01); *H05K 1/14* (2013.01); *H05K 2201/10757* (2013.01)

(56) References Cited

U.S. PATENT DOCUMENTS

| | | | | |
|---|---|---|---|---|
| 5,571,022 | A * | 11/1996 | Schaarschmidt .... | H01R 43/205 439/135 |
| 5,632,629 | A * | 5/1997 | Legrady ................ | H01R 12/57 439/78 |
| 5,957,739 | A * | 9/1999 | Bianca .................. | H01R 43/16 439/876 |
| 6,011,222 | A * | 1/2000 | Sekiya .................. | H01R 12/58 174/265 |
| 6,997,727 | B1 * | 2/2006 | Legrady ................ | H01R 12/57 439/246 |
| 9,780,016 | B2 | 10/2017 | Hagiwara et al. | |
| 2001/0004556 | A1 * | 6/2001 | Zhou .................. | G01R 1/06711 439/66 |
| 2005/0266741 | A1 * | 12/2005 | Miyamoto ......... | H01R 13/2442 439/862 |
| 2016/0211199 | A1 | 7/2016 | Hagiwara et al. | |
| 2017/0222346 | A1 * | 8/2017 | Kobayashi ............ | H01R 12/91 |

* cited by examiner

CONNECTION TERMINAL ASSEMBLED BODY AND CIRCUIT BOARD USING SAME CONNECTION TERMINAL ASSEMBLED BODY

TECHNICAL FIELD

The present invention relates to a connection terminal assembled body and a circuit board using this connection terminal assembled body, and, particularly, to a connection terminal assembled body to be soldered onto a circuit board by using "reflowing process" and a circuit board using this connection terminal assembled body.

BACKGROUND TECHNOLOGY

In a general industrial machine field, although mechanical control elements are driven by an electric motor, recently, an electric drive device has been adopted in which an electronic controller formed of a semiconductor element and the like for controlling the rotation speed and the rotation torque of an electric motor is integrally incorporated into the electric motor. That is, a mechanically and electrically integrated electric drive device has been adopted.

As an example of the mechanically and electrically integrated electric drive device, for example, in an electric power steering device of an automobile, a rotation direction and rotation torque of a steering shaft which rotates when a driver operates a steering wheel are detected, and, based on this detection value, steering assist torque is generated by driving the electric motor such that the steering wheel rotates in the same direction as the rotation direction of the steering shaft. In addition, to control this electric motor, an electronic control unit (ECU) is provided to the power steering device.

In this electric power steering device, the electric motor is accommodated in a motor housing having a cylindrical part made of, for example, aluminum alloy, and the electronic control unit is accommodated in an ECU housing arranged on the opposite side to the output shaft in the axial direction of the motor housing. The electronic control unit accommodated in the ECU housing is provided with a power supply section, a power conversion circuit section having a power switching element such as MOSFET for driving and controlling the electric motor, and with a control circuit section for controlling the power switching element, and the output terminal of the power switching element and the input terminal of the electric motor are electrically connected to each other through a bus bar.

In addition, electric power is supplied to the electronic control section accommodated in the ECU housing from a power supply through a connector assembled body made of synthetic resin, and a detection signal of a driving condition is sent thereto from a detection sensor. The connector assembled body functions as a lid body, is connected to the electronic control section so as to close the opening part formed in the ECU housing, and is fixed to the outer surface of the ECU housing by a fixing bolt.

By the way, in this type of the electronic control section, the power switching element of the power conversion section for driving and controlling the electric motor is controlled by a control signal from the control circuit section, and a circuit board of the control circuit section and a circuit board of the power conversion circuit section are connected by a connection terminal assembled body.

This connection terminal assembled body is placed onto the circuit board of the power conversion circuit section and then is adhered onto and fixed to the circuit board with solder.

The soldering of this type of the connection terminal assembled body is generally performed by "reflowing process". The "reflowing process" is a method in which paste-like solder that is called as cream solder is applied to a required place of a wiring pattern of the circuit board in advance, and the connection terminal assembled body is placed thereon and then the soldering is performed by directly heating the circuit board to melt the solder.

In addition, in general, placing stability of the connection terminal assembled body is poor. Therefore it is difficult to set the connection terminal assembled body into a self-standing state, and moreover, when the solder is melted in a soldering process, the connection terminal assembled body falls down. Therefore it is necessary to set the connection terminal assembled body into a self-standing state by using a special fixture, and productivity cannot be improved.

Here, as a method for smoothly performing the "reflowing process" by placing the connection terminal assembled body onto the circuit board by an automatic machine (chip mounter), for example, a method described in Japanese Patent Application Publication No. 2015-60958 (patent document 1) has been known. In the patent document 1, to automatically place the connection terminal assembled body onto the circuit board, the shape of the connection terminal assembled body is formed of a long plate-shaped placing section formed with a suction surface for pick up by an automatic machine and unit connection terminals for performing electrical connection between the circuit board and the circuit board connected to the placing section.

Here, the placing section also functions to set the connection terminal assembled body in a self-standing state, and when, after the connection terminal assembled body is placed in the self-standing state by being picked up by the automatic machine, the soldering by the "reflowing process" is completed, the part between the placing section and the unit connection terminals is cut such that the unit connection terminal remains on the circuit board. According to this configuration, by the placing section of the connection terminal assembled body, it becomes possible to perform the pick up by the automatic machine, and moreover, it is possible to place the connection terminal assembled body in the self-standing state, and thereby it becomes possible to solder the connection terminal assembled body onto the circuit board without using a special fixture.

PRIOR ART REFERENCE

Patent Document

Patent Document 1: Japanese Patent Application Publication 2015-60958

SUMMARY OF THE INVENTION

However, in the connection terminal assembled body described in the patent document 1, the placing section used when the connection terminal assembled body is placed on the circuit board so as to be in the self-standing state by being picked up by the automatic machine is cut and discarded, when the "reflowing process" is completed. It is therefore necessary to add a cutting process to the "reflowing process", and it causes an inhibiting factor of improving productivity. Moreover, since the placing section is cut from the unit connection terminals and then discarded, it becomes wasteful material. In addition, the shape of the connection terminal assembled body becomes complicated, and it is difficult to efficiently perform material cutting, and thereby it becomes a factor of the rise in a manufacturing unit price.

An object of the present invention is to provide a new connection terminal assembled body that is capable of solving at least one problem mentioned above in the "reflowing process" and that is capable of being sucked by an automatic machine, more preferably capable of standing by itself on a circuit board, and to provide a circuit board in which this terminal assembled body is used.

Here, the connection terminal assembled body is one including a connection terminal combined with one unit connection terminal or a plurality of (two or more) unit connection terminals. In addition, the circuit board is not limited to the circuit board of a power conversion circuit, and various circuit boards are included.

In a first feature of the present invention, a connection terminal assembled body includes: at least one unit connection terminal, wherein the unit connection terminal has: an adhesion section to be soldered onto a circuit board and extending in a longitudinal direction; a terminal section extending in a direction approximately orthogonal to the adhesion section extending in the longitudinal direction and to be connected to a counterpart-side circuit board; a bent section bent so as to connect the adhesion section and the terminal section; and a suction member made of synthetic resin, fixed more to a terminal section side than the bent section, and having a suction surface to be sucked by an automatic machine. More preferably, a projection position where a gravity center position of the entire unit connection terminal including the suction member is projected toward an adhesion section side is included in an adhesion range of the adhesion section.

In a second feature of the present invention, a connection terminal assembled body includes: a plurality of unit connection terminals, wherein each of the unit connection terminals has: an adhesion section to be soldered onto a circuit board and extending in a longitudinal direction; a terminal section extending in a direction approximately orthogonal to the adhesion section extending in the longitudinal direction and to be connected to a counterpart-side circuit board; and a bent section bent so as to connect the adhesion section and the terminal section, wherein a terminal section side more than the bent section of each of the unit connection terminals is integrally connected by a connection-suction member made of synthetic resin, and wherein a suction portion having a suction surface to be sucked by an automatic machine is formed at an approximately center of the connection-suction member. More preferably, a projection position where a gravity center position of the entire connection terminal assembled body including the connection-suction member is projected toward an adhesion section side is included in an adhesion range of the entire connection terminal assembled body.

According to the present invention, since the suction member that becomes the suction surface to be sucked by the automatic machine is provided to the unit connection terminal, or the connection-suction member equipped with the suction portion that becomes the suction surface to be sucked by the automatic machine is provided to the connection terminal assembled body, a cutting process for cutting the suction member or the connection-suction member can be omitted, and productivity can be improved. Moreover, the rise in a manufacturing unit price can be suppressed. Furthermore, the unit connection terminal or the connection terminal assembled body can be soldered in a self-standing state, and the soldering can be performed without using special jigs, such as a fixture, and consequently, productivity can be improved.

MODE FOR IMPLEMENTING THE INVENTION

In the following, although an embodiment of the present invention will be explained in detail with reference to the drawings, the present invention is not limited to the following embodiments, and, in a technical concept of the present invention, various variations and applications are included within the scope of the present invention.

First, with reference to FIG. 1, the simple configuration of an electric power steering device that is an example of an electric drive device and, with reference to FIG. 7, the configuration of a power conversion circuit unit mounting a conventional connection terminal assembled body will be explained.

Figure 1:
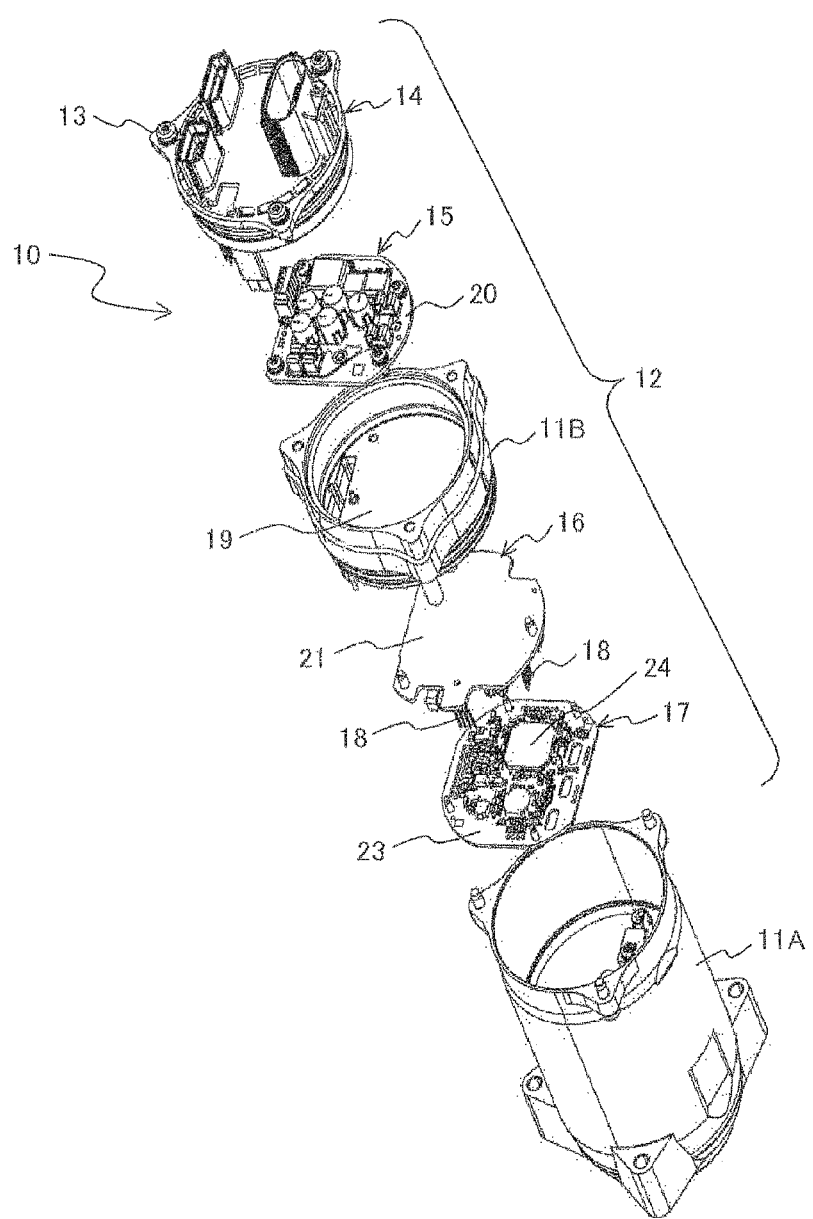
FIG. 1 is an exploded perspective view of an electric power steering device that is an example of an electric drive device.

In FIG. 1, an exploded perspective view of an electric power steering device 10 is shown. Here, an electric motor is usually accommodated in a motor housing 11A. The motor housing 11A is made of aluminum alloy separately from that of an ECU housing 11B equipped with a heat dissipation substrate. However, the both housings may be formed as one housing.

An electronic control unit 12 is configured of the ECU housing 11B connected on the side opposite to the output shaft of the electric motor inside the motor housing 11A which is not shown in the drawings, and of a lid body 14 connected to the EUC housing 11B by three fixing bolts 13. The lid body 14 is used as a connector terminal assembled body, and is formed by injection molding with synthetic resin. In addition, at the same time of this, various connector wiring parts are buried into the lid body 14 by insert molding.

A power supply circuit section 15 is provided in the accommodation space formed of the ECU housing 11B and the lid body 14, and a power conversion circuit section 16 and a control circuit section 17 are disposed in the accommodation space formed of the ECU housing 11B and the motor housing 11A. A connection terminal assembled body 18 to which the present embodiment is applied is fixed to the power conversion circuit section 16 by "reflowing process" with solder. The connection terminal assembled body 18 is connected to the control circuit section 17 to transmit a control signal and other information signals from the control circuit section 17 to the power conversion circuit section 16. The power supply circuit section 15, the power conversion circuit section 16 and the control circuit section 17 form an electronic controller assembled body.

A heat dissipation substrate 19 made of metal such as aluminum and aluminum alloy is disposed inside the ECU housing 11B. This heat dissipation substrate 19 is formed integrally with the ECU housing 11B. In addition, metal circuit boards 20 and 21 on which electrical components forming the power supply circuit section 15 and the power conversion circuit section 16 are mounted are fixed to the both side surfaces of the heat dissipation substrate 19 by one-side mounting.

As mentioned above, the heat dissipation substrate 19 having a predetermined thickness and made of aluminum or aluminum alloy is disposed between the metal circuit board 20 and the metal circuit board 21. This heat dissipation substrate 19 functions as a heat dissipation member, and is formed integrally with the ECU housing 11B, so as to dissipate heat to the outside air from the ECU housing 11B. Here, in the metal circuit boards 20 and 21 and the heat dissipation substrate 19, a heat dissipation function material, such as a heat dissipation adhesive, a heat dissipation sheet and heat dissipation grease, having high heat conductivity is interposed between the metal circuit boards 20 and 21 and the heat dissipation substrate 19 to increase thermal contact.

The power supply circuit section 15 mainly functions to generate a high-voltage DC power used for an inverter device for driving an electric motor and to generate a low-voltage DC power used for control circuits such as a microcomputer, and is disposed between the lid body 14 and the heat dissipation substrate 19.

In addition, the power conversion circuit section 16 to execute an inverter control mainly functions to drive the electric motor, and is disposed on the side of the heat dissipation substrate 19 opposite to the side in which the power supply circuit section 15 is disposed. The metal circuit board 21 of the power conversion circuit section 16 is disposed so as to face the metal circuit board 20 of the power supply circuit section 15 through the heat dissipation substrate 19.

Figure 7:
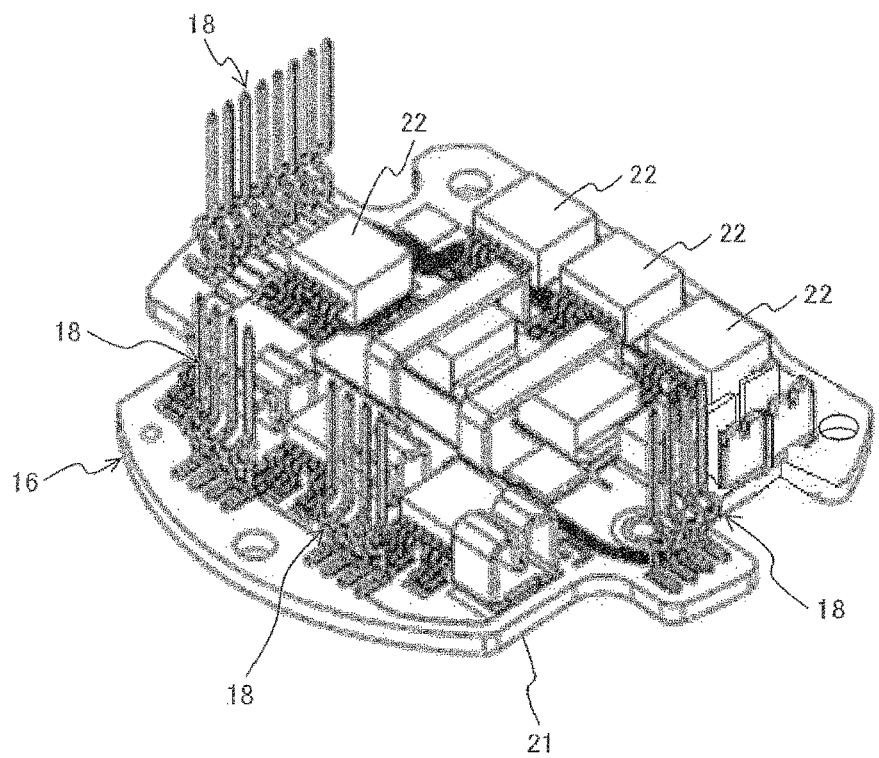
FIG. 7 is an external perspective view of a power conversion circuit unit mounting a conventional connection terminal assembled body.

As shown in FIG. 7, a conventional power conversion circuit section 16 is mounted with, on a metal circuit board 21 made of metal with high heat conductivity such as aluminum, switching elements (power switching elements) 22 formed of a plurality of MOSFET, output connector terminals (not shown in the drawings) for output of these, and connection terminal assembled bodies 18 each equipped with a plurality of unit connection terminals to feed back the input of input signals, such as gate, drain and source, to control the switching elements 22, and operation conditions of the switching elements 22 to the control circuit section 17. In addition, inverter-side connector terminals (not shown in the drawings) receiving the power supply from the power supply circuit section 15 are also provided. Moreover, three switching elements 22 for fail safe are provided other than six switching elements 22 for controlling an electric motor.

Each of the conventional connection terminal assembled bodies 18 is fixed to the metal circuit board 21 with solder by, for example, the method described in the patent document 1. That is, by an automatic machine, the placing section of each of the connection terminal assembled bodies 18 is sucked and mounted on the metal circuit board 21 with a self-standing-state, and the soldering is performed by "reflowing process". When the soldering by the "reflowing process" is completed, the part between the placing section and the unit connection terminals is cut so as to remain the unit connection terminals on the metal circuit board 21.

The metal circuit board 21 has a structure in which an insulation layer is formed on an aluminum board and a wiring pattern made from a resist film and copper foil is formed on the insulation layer, and electrical components are mounted on this wiring pattern and then are electrically connected to each other. Each of the unit connection terminals is also soldered to a predetermined position on the wiring pattern. Here, although FIG. 7 shows a side of the metal circuit board 21 in which the above-mentioned electrical components are mounted for easy understanding, in fact, as shown in FIG. 1, the metal circuit board 21 is disposed such that the electrical components face downward.

Returning to FIG. 1, the control circuit section 17 mainly functions to control the switching of switching elements 22 of the power conversion circuit section 16, and is disposed between the power conversion circuit section 16 and the motor housing 11A. The control circuit section 17 is mounted with, on a resin board 23 made of synthetic resin, a microcomputer 24 and the like to control the switching elements 22 and the like. The resin board 23 is disposed apart from the power conversion circuit section 16 with a predetermined distance, and electrical components of the power conversion circuit section 16 and electrical components of the control circuit section 17 are arranged in the space between the resin board 23 and the power conversion circuit section 16. In addition, the control circuit section 17 is connected to the power conversion circuit section 16 by the above-mentioned connection terminal assembled bodies 18.

As is clear from FIG. 7, each of the connection terminal assembled bodies 18 is soldered to a wiring pattern, and "reflowing process" is adopted to the soldering. Therefore when the "reflowing process" is performed, it is necessary to set each of the connection terminal assembled bodies 18 in a self-standing state for automation.

However, if each of the connection terminal assembled bodies 18 having the structure of the patent document 1 is used, when the "reflowing process" is completed, the placing section used for setting each of the connection terminal assembled bodies 18 in the self-standing state by being sucked by an automatic machine is cut and discarded. Therefore it is necessary to add a cutting process to the "reflowing process", and it becomes an obstruction factor when productivity is further improve. Moreover, since the placing section is cut from the unit connection terminals and then is discarded, it becomes an unnecessary material, and since the shape of each of the connection terminal assembled bodies becomes complicated, it is difficult to efficiently perform material cutting, and, consequently, it becomes a factor of rising in a manufacturing unit price of the circuit board.

Figure 2:
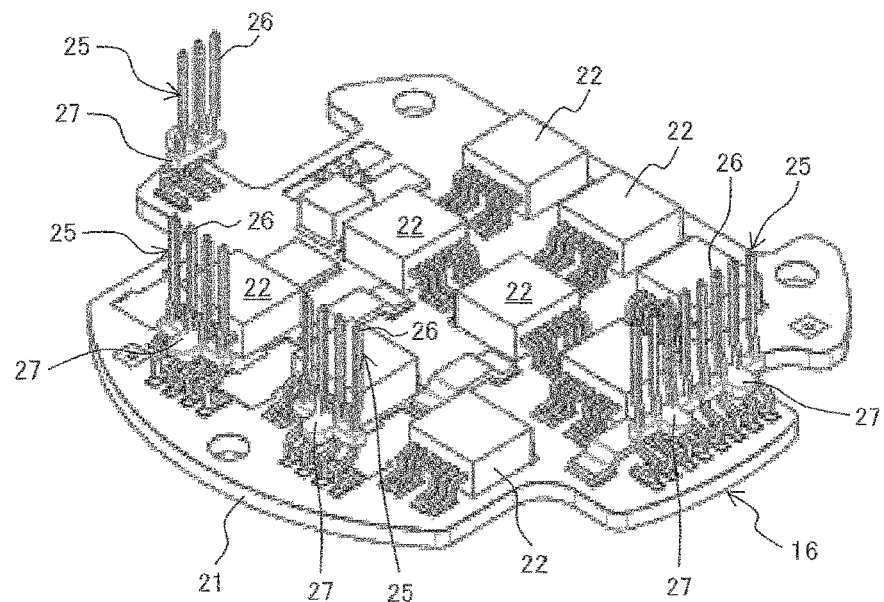
FIG. 2 is an external perspective view of a power conversion circuit unit mounting a connection terminal assembled body that is an embodiment of the present invention.

Therefore, in the present invention, a connection terminal assembled body that becomes an embodiment shown in FIG. 2 to FIG. 6E is proposed. As an embodiment corresponding to FIG. 7, FIG. 2 shows a state in which each connection terminal assembled body 25 in the present embodiment is soldered to a metal circuit board 21 of a power conversion section 16. In addition, in FIG. 2, as an example, the arranged position of each of the connection terminal assembled bodies 25 is changed, as compared with that shown in FIG. 7.

In FIG. 2, the connection terminal assembled bodies 25 each becoming the present embodiment each have a structure in which a plurality of unit connection terminals 26 are connected to each other by a connection-suction member 27. The connection-suction member 27 is formed with a suction surface to be sucked by a suction function of a vacuum suction nozzle of an automatic machine. Moreover, a projection position where the center of gravity position of each of the entire connection terminal assembled bodies 25 is projected toward an adhesion section side (soldering side) is included in the adhesion range of an adhesion section of each of the connection terminal assembled bodies 25 to the metal circuit board 21.

This will be mentioned later with reference to the drawings.

The connection-suction member 27 having the suction surface is formed integrally with the unit connection terminals 26 remaining on the metal circuit board 21, and therefore it is not necessary to add a working process for cutting the placing section described in the patent document 1. In addition, since the center of the gravity position of each of the connection terminal assembled bodies 25 each including the connection-suction member 27 is included in the adhesion range of the adhesion section to the metal circuit board 21, each of the connection terminal assembled bodies 25 can be set in the self-standing state and then is soldered, and productivity can be therefore improved because the soldering can be performed without using special jigs, such as a fixture. Moreover, since the gravity center position can be set at a low position by the connection-suction member 27, the self-standing state of each of the connection terminal assembled bodies 25 is improved, and thereby the self-standing function can be further enhanced.

Next, a specific configuration of a connection terminal assembled body will be explained with reference to the drawings. FIG. 3A to FIG. 3E and FIG. 4A to FIG. 4E each show a first embodiment in which one unit connection terminal 26 is fixed with a suction member 28 including a suction surface. In addition, although the suction member 28 has basically the same function as the connection-suction member 27 shown in FIG. 2, it is different in that a plurality of the unit connection terminals 26 are not joined.

In each of FIG. 3A to FIG. 3E, the unit connection terminal 26 is basically formed of three regions. That is, the unit connection terminal 26 is formed by punching a metal plate having conductivity into a predetermined shape and bending it into a substantially L shape. In addition, the unit connection terminal 26 is formed of an adhesion section 29 which is soldered to a metal circuit board 21 and which extends in a longitudinal direction, a terminal section 30 which extends in the direction orthogonal to the adhesion section 29 extending in the longitudinal direction and which is connected to a counterpart-side circuit board, and of a bent section 31 which is bent so as to connect the adhesion section 29 with the terminal section 30. The bent section 31 is formed by bending the lower end part of the unit connection terminal 26 into a nearly U shape, and the lower side of the bent section 31 is the adhesion section 29.

The suction member 28 made of synthetic resin is fixed on a terminal section 30 side of the bent section 31. This suction member 28 is formed integrally with the unit connection terminal 26 by, for example, insert molding. The arrangement position of the suction member 28 is preferably set at a position between the distal end of the terminal section 30 and the adhesion section 29, more preferably in an area P from an intermediate position C between the distal end of the terminal section 30 and the adhesion section 29 to the bent section 31. With this, the gravity center of the entire unit connection terminal 26 including the suction member 28 can be lowered toward an adhesion section 29 side, and, consequently, the seating of the unit connection terminal 26 when placed on the metal circuit board 21 is improved.

In addition, the surface on the terminal section 30 side of the suction member 28 is formed in a plane shape, and this surface becomes a suction surface 32. This suction surface 32 is used to place the adhesion section 29 of the unit connection terminal 26 onto cream solder applied to a wiring pattern of the metal circuit board 21 by being sucked by an automatic machine when "reflowing process" is performed. Therefore, as mentioned above, it is not necessary to add the cutting process for cutting the placing section described in the patent document 1.

Moreover, the distal end on a suction surface 32 side of the suction member 28 projects outward more than the bent section 31 when viewed in the longitudinal direction of the adhesion section 29. In a state of being placed on the metal circuit board 21, this distal end is formed with an inclined surface 33 inclined downward toward an adhesion section 29 side. This inclined surface 33 is formed to observe the adhesion state (fillet forming state and the like) between the metal circuit board 21 and the adhesion section 29 by an appearance image observation device, in a state in which the unit connection terminal 26 is soldered to the metal circuit board 21. That is, there is possibility that the observation cannot be sufficiently performed if the inclined surface 33 is not formed, because the image observation is observed in an oblique direction shown in an arrow "A". Accordingly, in the present embodiment, the inclined surface 33 inclined downward is formed at the distal end on the suction surface 32 side.

Figure 3A:
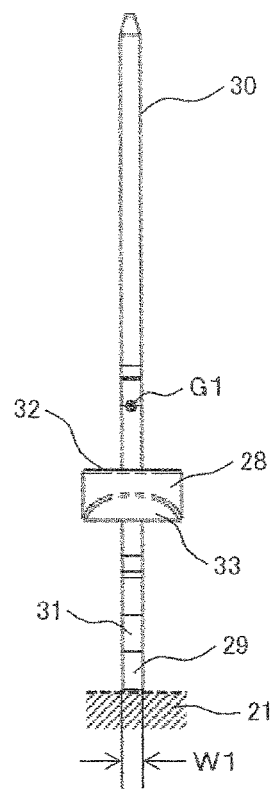
FIG. 3A is a front view of a connection terminal assembled body formed of one unit connection terminal that is a first embodiment of the present invention.
Figure 3B:
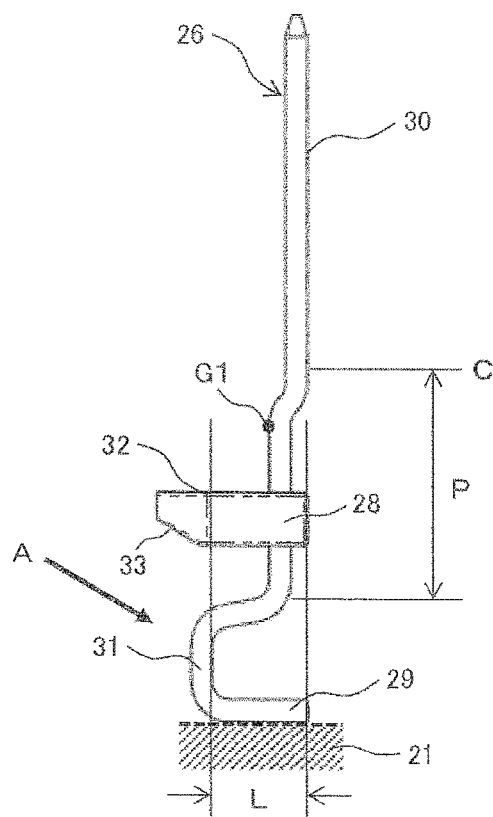
FIG. 3B is a side view of the connection terminal assembled body shown in FIG. 3A.
Figure 3C:
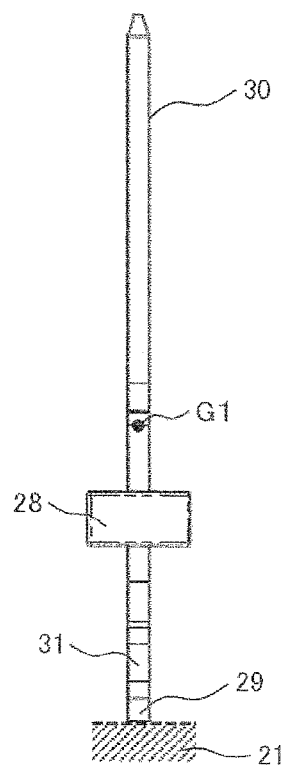
FIG. 3C is a back view of the connection terminal assembled body shown in FIG. 3A.
Figure 3D:
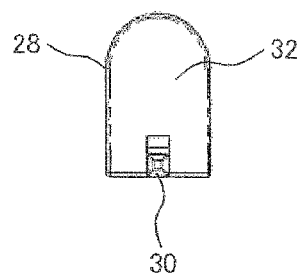
FIG. 3D is a top view of the connection terminal assembled body shown in FIG. 3A.
Figure 3E:
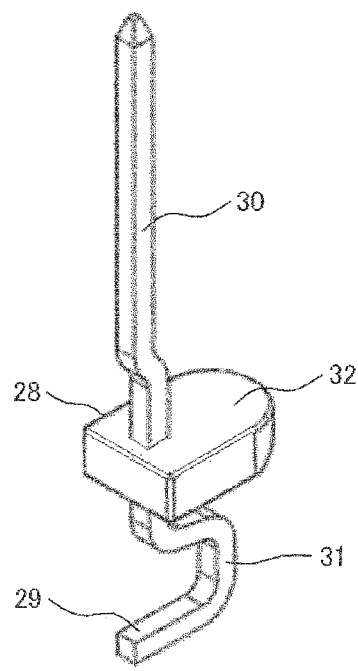
FIG. 3E is an external perspective view of the connection terminal assembled body shown in FIG. 3A.

In addition, as shown in FIG. 3D, the distal end side of the suction surface 32 in the suction member 28 is formed in an arc shape, to match the shape of a vacuum suction nozzle for vacuum suction. In addition, if the shape of the distal end is a rectangular shape, its corners become an excess weight. Therefore, the distal end side is formed in an arc shape to reduce weight.

As mentioned above, since the suction member 28 is attached to the unit connection terminal 26, in the process of the "reflowing process", the cutting process for cutting the placing section of the patent document 1 becomes unnecessary, and productivity can be improved. In addition, the suction member 28 made of synthetic resin is simply used, it is not necessary to provide the placing section like the patent document 1, and, consequently, it becomes possible to save the material for the connection terminal.

Moreover, in the present embodiment, as shown in FIG. 3A to FIG. 3C, a gravity center G1 of the entire unit connection terminal 26 including the suction member 28 is included in a rage of a length "L" in the longitudinal direction of the adhesion section 29, and included in a rage of a length "W1" in the short direction of the adhesion section 29. That is, in a state in which the gravity center G1 of the entire unit connection terminal 26 is projected toward the adhesion section 29 side, the gravity center G1 is included in the adhesion range of the adhesion section 29. With this, it is possible to set the unit connection terminal 26 including the suction member 28 in a self-standing state.

Furthermore, since the suction member 28 is arranged in the area P between the intermediate position C between the distal end of the terminal section 30 and the adhesion section 29 and the bent section 31, the gravity center G1 of the entire unit connection terminal 26 can be lowered toward the adhesion section 29 side, and the seating of the unit connection terminal 26 when placed on the metal circuit board 21 is improved, and thereby a self-standing function can be further enhanced.

Next, each of FIG. 4A to FIG. 4E shows a variation of the above-mentioned first embodiment, and it is different in that the width "W1" of the adhesion section 29 and the bent section 31 shown in FIG. 3A is widened to a width "W2". The variation is the same as the above-mentioned embodiment except this difference, and redundant explanation is omitted.

Figure 4A:
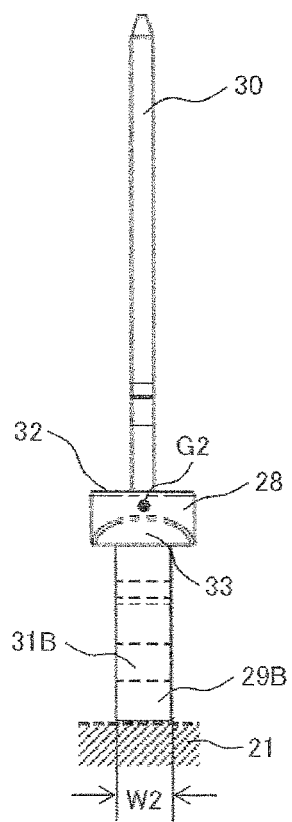
FIG. 4A is a front view of a connection terminal assembled body that is a variation of the first embodiment in the present invention.
Figure 4B:
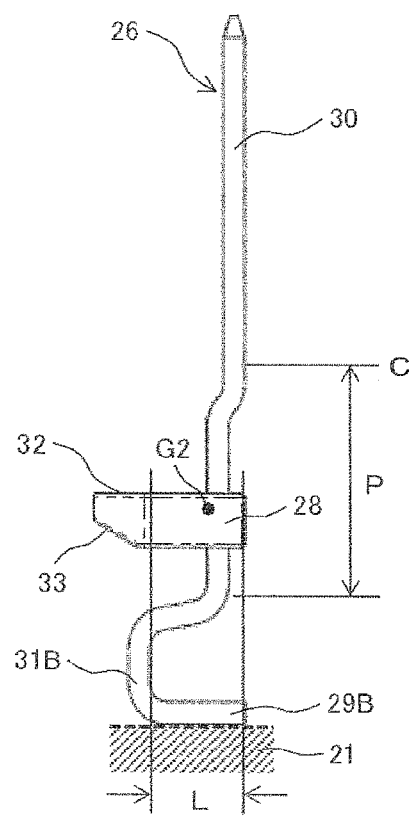
FIG. 4B is a side view of the connection terminal assembled body shown in FIG. 4A.
Figure 4C:
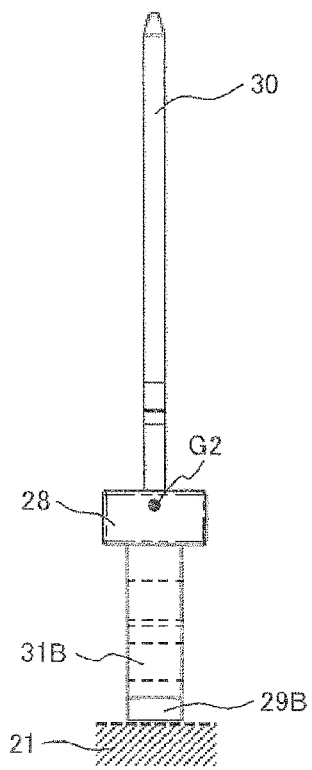
FIG. 4C is a back view of the connection terminal assembled body shown in FIG. 4A.
Figure 4D:
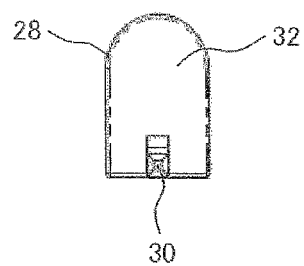
FIG. 4D is a top view of the connection terminal assembled body shown in FIG. 4A.
Figure 4E:
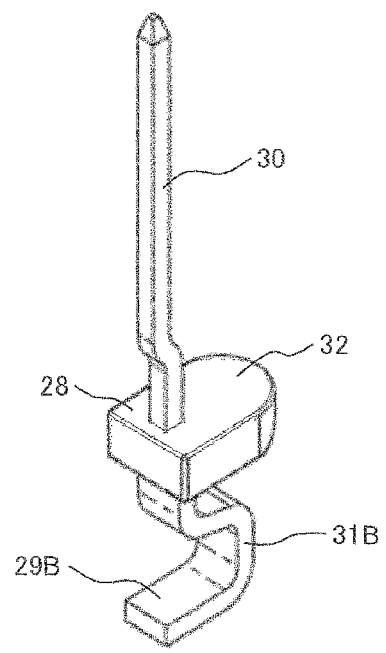
FIG. 4E is an external perspective view of the connection terminal assembled body shown in FIG. 4A.

As shown in FIG. 4A, the width "W2" of an adhesion section 29B including a bent section 31B side from a suction member 28 and a bent section 31B is wider than the width "W1" of the adhesion section 29 and the bent section 31 of FIG. 3A. That is, a width at an arbitrary position from the suction member 28 to the adhesion section 29B is formed to be longer than the width from the suction member 28 to the distal end of a terminal section 30. In the present variation, the width from the suction member 28 to the adhesion section 29B is formed to be longer than the width from the suction member 28 to the distal end of the terminal section 30.

Consequently, a gravity center G2 becomes close to the adhesion section 29B side because the weight of the widened part increases, and thereby a self-standing function is improved. Moreover, the adhesion range (adhesion area) of the adhesion section 29B is widened, and the seating of a unit connection terminal 26 is improved, and thereby the self-standing function can be further enhanced.

Next, a second embodiment of the present invention will be explained. The present embodiment is an example of a connection terminal assembled body 25 in which three unit connection terminals 26 shown in FIG. 4A to FIG. 4E are connected to each other. In this embodiment, by a connection-suction member 27 made of synthetic resin, the three unit connection terminals 26 are connected to and fixed to each other.

In FIG. 5A to FIG. 5E, a connection-suction member 27 made of synthetic resin is fixed on a terminal 30 side of the bent section 31B of each of the unit connection terminals 26. This connection-suction member 27 is integrally formed so as to fix and connect the unit connection terminals 26 to each other at equal intervals by insert molding.

The arrangement position of the connection-suction member 27 is preferably set at a position between the distal ends of the terminal sections 30 and the adhesion sections 29B, more preferably in an area P from an intermediate position C between the distal ends of the terminal sections 30 and the adhesion sections 29 to the bent sections 31B. With this, a gravity center G3 of the entire unit connection terminals 26 including the connection-suction member 27 can be lowered toward the adhesion section 29 side, and the seating of the connection terminal assembled body 25 when placed on the metal circuit board 21 is improved.

The connection-suction member 27 is formed integrally with a connection part 34 and a suction portion 35, and the unit connection terminals 26 are connected to each other by the connection part 34. In addition, the suction portion 35 is formed at an approximately center of the connection-suction member 27, that is, at a position near the unit connection terminal 26 located in the middle of the three unit connection terminals 26. The function of this suction portion 35 is the same as that of the suction member 28 of the first embodiment, and its explanation is omitted.

Figure 5A:
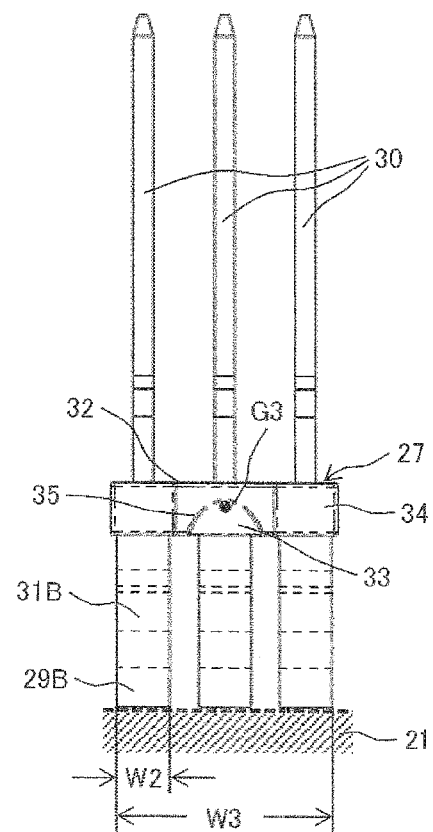
FIG. 5A is a front view of a connection terminal assembled body formed of three unit connection terminals that is a second embodiment of the present invention.
Figure 5B:
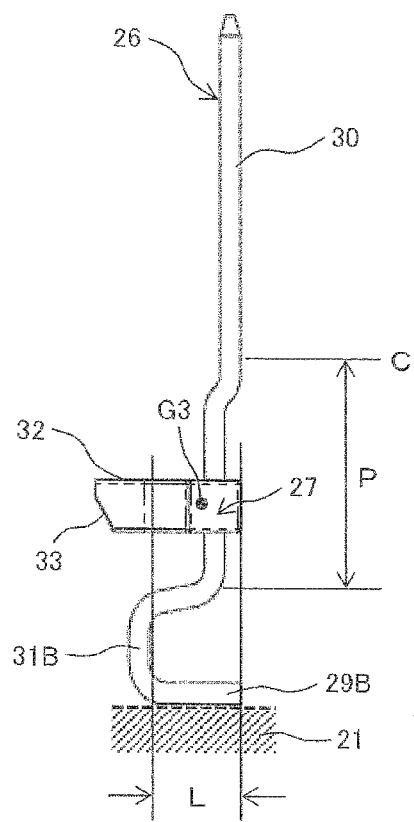
FIG. 5B is a side view of the connection terminal assembled body shown in FIG. 5A.
Figure 5C:
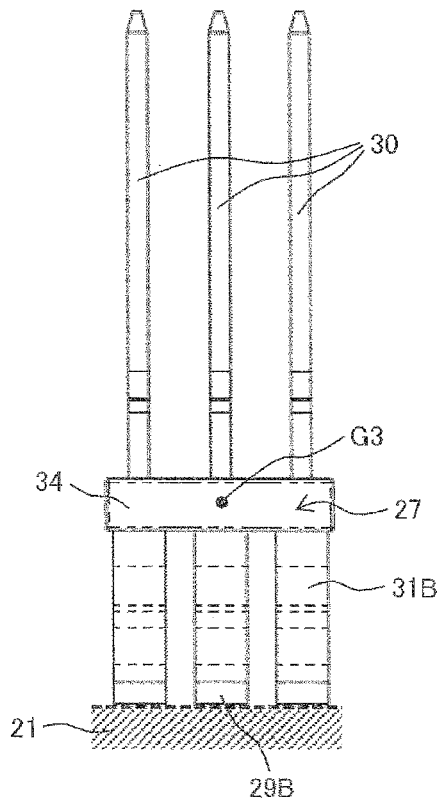
FIG. 5C is a back view of the connection terminal assembled body shown in FIG. 5A.
Figure 5D:
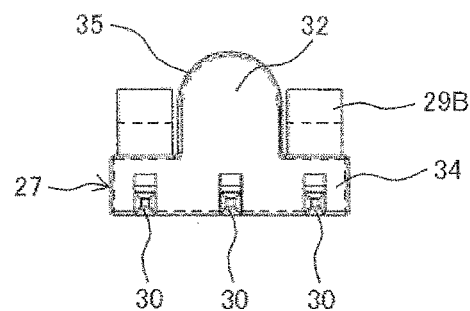
FIG. 5D is a top view of the connection terminal assembled body shown in FIG. 5A.
Figure 5E:
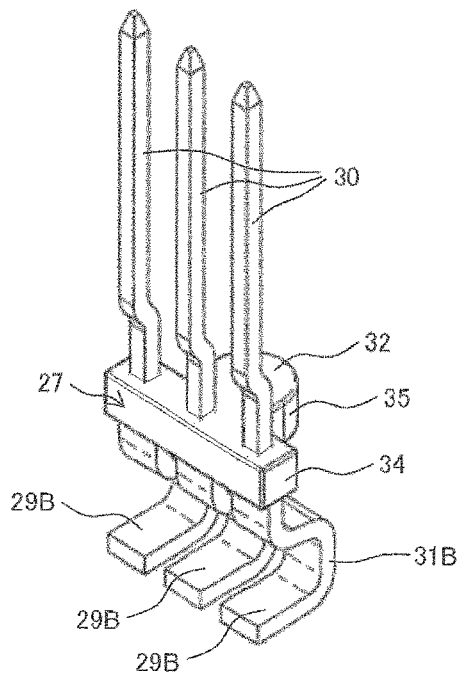
FIG. 5E is an external perspective view of the connection terminal assembled body shown in FIG. 5A.

Moreover, in the embodiment, as shown in FIG. 5A to FIG. 5C, the gravity center G3 of the entire connection terminal assembled body 25 including the connection-suction member 27 is included in a range of a length "L" in the longitudinal direction of each adhesion section 29B, and moreover, it is included in a range of a length "W3" in the direction in which the three adhesion sections 29B of the connection terminal assembled body 25 are connected to each other. That is, in a state in which the gravity center G3 of the entire connection terminal assembled body 25 is projected toward the adhesion section 29 side, the gravity center G3 is included in the entire adhesion range determined by the width "W3" of the three adhesion sections 29B connected to each other of the connection terminal assembled body 25 and by the length "L" in the longitudinal direction of each adhesion section 29B. With this, it is possible to set the connection terminal assembled body 25 including the connection-suction member 27 in the self-standing state.

In addition, as shown in FIG. 5A, the width "W2" of each of the adhesion sections 29B and each of the bent section 31B is longer than the width "W1" of the adhesion section 29 and the bent section 31 of FIG. 3A. When connected to each other, since the length of the width of this connected part becomes longer and the weight thereof increases, the gravity center G3 becomes close to the adhesion section 29B side, and thereby a self-standing function is improved. Moreover, the adhesion range (adhesion area) of the entire three adhesion sections 29B is widened, and the seating of the connection terminal assembled body 25 is improved, and thereby the self-standing function can be further enhanced.

Furthermore, since the connection-suction member 27 is arranged in the area P from the intermediate position C between the distal ends of the terminal sections 30 and the adhesion sections 29B to the bent sections 31B, the gravity center G3 of the entire unit connection terminals 26 can be lowered toward the adhesion section 29B side, and the seating of the connection terminal assembled body 25 when placed on the metal circuit board 21 is improved. Moreover, the self-standing function can be further enhanced.

In this way, since the connection-suction member 27 equipped with the suction surface is formed integrally with the unit connection terminals 26 which remain on the metal circuit board 21, it is unnecessary to add the cutting process for cutting the placing section like the patent document 1. Moreover, since the connection-suction member 27 made of synthetic resin is simply used, it is not necessary to provide the placing section like the patent document 1, and material cutting for the connection terminal becomes easy, and, consequently, it becomes possible to suppress the rise in a manufacturing unit price.

In addition, since the gravity center position of the connection terminal assembled body 25 including the connection-suction member 27 is included in the adhesion range of the adhesion sections to the metal circuit board 21, it is possible to solder the connection terminal assembled body 25 in a self-standing state, without using special jigs, such as a fixture, and productivity can be improved. Moreover, since the position of the gravity center can be set to a lower position by the connection-suction member 27, the seating of the connection terminal assembled body 25 is improved, and thereby the self-standing function can be further enhanced.

Next, a third embodiment of the present invention will be explained. The present embodiment is an example of a connection terminal assembled body 25 in which four unit connection terminals 26 shown in FIG. 3A to FIG. 3E are connected to each other. In this embodiment, by a connection-suction member 27 made of synthetic resin, the four unit connection terminals 26 are connected to and fixed to each other.

In each of FIG. 6A to FIG. 6E, the connection-suction member 27 made of synthetic resin is fixed on a terminal section 30 side of a bent section 31 of each of the unit connection terminals 26. This connection-suction member 27 is integrally formed so as to connect and fix the unit connection terminals 26 to each other at equal intervals by, for example, insert molding.

The arrangement position of the suction-connection member 27 is preferably set at a position between the distal ends of terminal sections 30 and adhesion sections 29, more preferably in an area P from an intermediate position C between the distal ends of the terminal sections 30 and the adhesion sections 29 to bent sections 31.

With this, a gravity center G4 of the entire unit connection terminals 26 including the connection-suction member 27 can be lowered toward the adhesion section 29 side, and the seating of the connection terminal assembled body 25 when placed on a metal circuit board 21 is improved.

In the same way as the second embodiment, the connection-suction member 27 is formed integrally with a connection part 34 and a suction portion 35, and the unit connection terminals 26 are connected to each other by the connection part 34. In addition, the suction portion 35 is formed at an approximately center of the connection-suction member 27, that is, at a position near the middle of the four unit connection terminals 26. The function of this suction portion 35 is the same as that of the suction member 28 of the first embodiment, and its explanation is omitted.

Figure 6A:
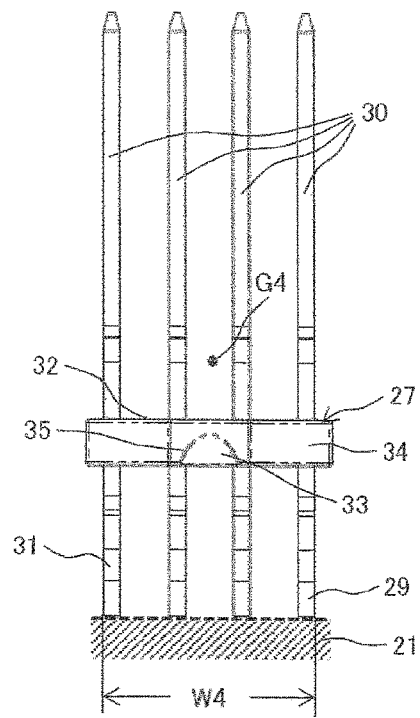
FIG. 6A is a front view of a connection terminal assembled body formed of four unit connection terminals that is a third embodiment of the present invention.
Figure 6B:
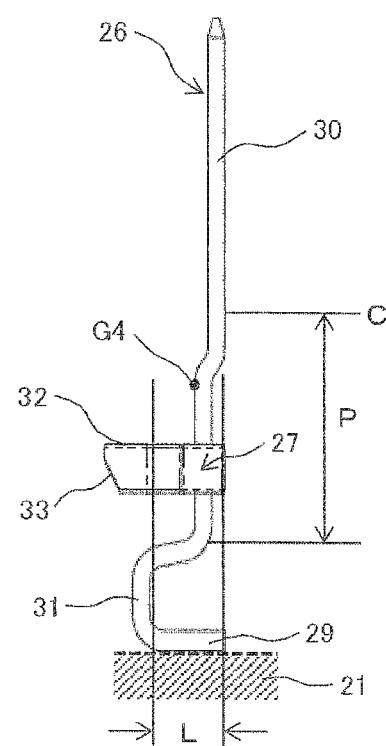
FIG. 6B is a side view of the connection terminal assembled body shown in FIG. 6A.
Figure 6C:
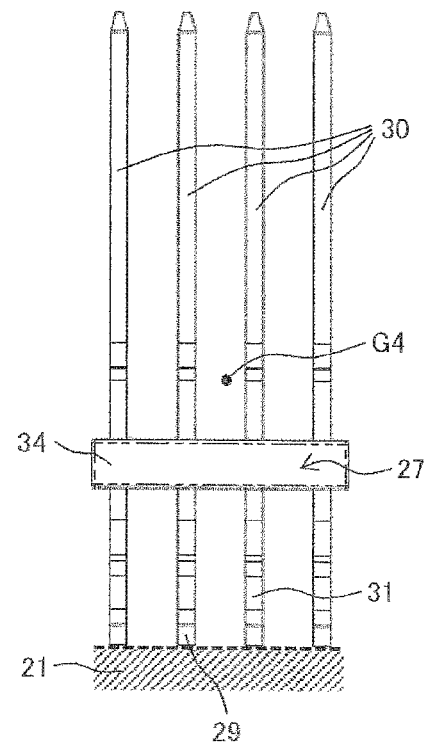
FIG. 6C is a back view of the connection terminal assembled body shown in FIG. 6A.
Figure 6D:
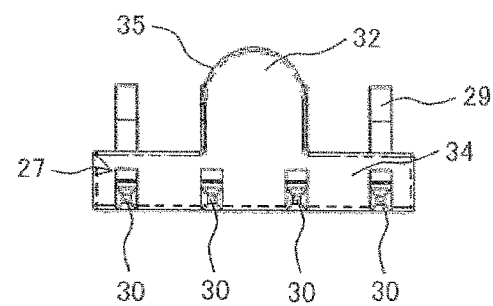
FIG. 6D is a top view of the connection terminal assembled body shown in FIG. 6A
Figure 6E:
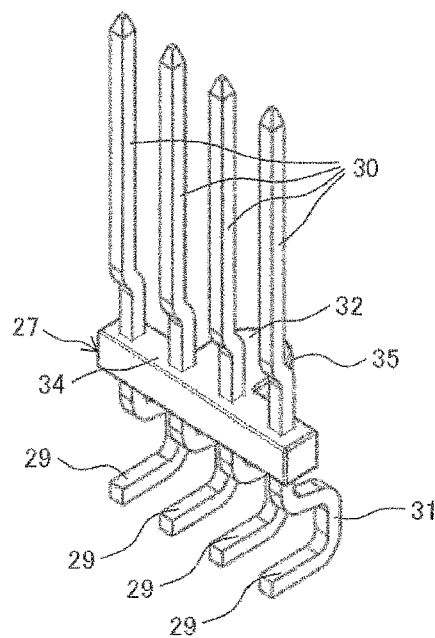
FIG. 6E is an external perspective view of the connection terminal assembled body shown in FIG. 6A.

Moreover, in the present embodiment, as shown in FIG. 6A to FIG. 6C, the gravity center G4 of the entire connection terminal assembled body 25 including the connection-suction member 27 is included in a range of a length "L" in the longitudinal direction of each adhesion section 29, and moreover, it is included in a range of a length "W4" in the direction in which the four adhesion sections 29 of the connection terminal assembled body 25 are connected to each other. That is, in a state in which the gravity center G4 of the entire connection terminal assembled body 25 is projected toward the adhesion section 29 side, the gravity center G4 is included in the entire adhesion range determined by the width "W4" of the four adhesion sections 29 connected to each other of the connection terminal assembled body 25 and by the length "L" in the longitudinal direction of each adhesion section 29. With this, it is possible to set the connection terminal assembled body 25 including the connection-suction member 27 in a self-standing state.

Furthermore, since the connection-suction member 27 is arranged in the area P from the intermediate position C between the distal ends of the terminal sections 30 and the adhesion sections 29 to the bent sections 31, the center of gravity of the entire connection terminal assembled body 25 can be lowered toward the adhesion section 29 side, and the seating of the connection terminal assembled body 25 when placed on the metal circuit board 21 is improved, and thereby a self-standing function can be further enhanced.

In this way, since the connection-suction member 27 equipped with the suction surface is formed integrally with the unit connection terminals 26 which remain on the metal circuit board 21, it is unnecessary to add the cutting process for cutting the placing section like the patent document 1. Moreover, since the connection-suction member 27 made of synthetic resin is simply used, it is not necessary to provide the placing section like the patent document 1, and material cutting for the connection terminal becomes easy, and, consequently, it becomes possible to suppress the rise in a manufacturing unit price.

In addition, since the gravity center position of the connection terminal assembled body 25 including the connection-suction member 27 is included in the adhesion range of the adhesion sections to the metal circuit board 21, it is possible to solder the connection terminal assembled body 25 in a self-standing state, and since the soldering can be performed without using special jigs, such as a fixture, productivity can be improved. Moreover, since the gravity center position can be set to a lower position by the connection-suction member 27, the seating of the connection terminal assembled body 25 is improved, and thereby the self-standing function can be further enhanced.

As mentioned above, according to the present invention, a unit connection terminal is formed of an adhesion section to be soldered onto a circuit board and extending in a longitudinal direction, a terminal section extending in the direction approximately orthogonal to the adhesion section extending in the longitudinal direction and to be connected to a counterpart-side circuit board, a bent section bent so as to connect the adhesion section and the terminal section, and of a suction member made of synthetic resin, fixed more to the terminal side than the bent section, and having a suction surface sucked by an automatic machine. More preferably, a projection position where the center of gravity position of the entire unit connection terminal including the suction member is projected toward the adhesion section side is included in the adhesion range of the adhesion section.

In addition, according to the present invention, each of a plurality of unit connection terminals of a connection terminal assembled body in which the unit connection terminals are combined is formed of an adhesion section to be soldered onto a circuit board and extending in a longitudinal direction, a terminal section extending in the direction approximately orthogonal to the adhesion section extending in the longitudinal direction and to be connected to a counterpart-side circuit board, a bent section bent so as to connect the adhesion section and the terminal section, and the terminal side more than the bent section of each of the unit connection terminals is integrally connected by a connection-suction member made of synthetic resin. Moreover, a suction portion having a suction surface to be sucked by an automatic machine is formed at an approximately center of the connection-suction member. More preferably, a projection position where the center of gravity position of the entire connection terminal assembled body including the connection-suction member is projected toward the adhesion section side is included in the adhesion range of the adhesion sections of the entire connection terminal assembled body.

Therefore, since the suction member that becomes the suction surface to be sucked by the automatic machine is provided to the unit connection terminal, or the connection-suction member equipped with the suction portion that becomes the suction surface to be sucked by the automatic machine is provide to the connection terminal assembled body, a working process for cutting the suction member or the connection-suction member can be omitted, and productivity can be improved, and thereby it is possible to suppress the rise in a manufacturing unit price. Furthermore, the unit connection terminal or the connection terminal assembled body can be soldered in a self-standing state, and the soldering can be performed without using special jigs, such as a fixture, and thereby productivity can be improved.

In addition, the present invention is not limited to the above-mentioned embodiments, and various variations are included.

For example, although the above embodiments are explained in detail to clearly explain the present invention, the present invention is not always limited to one having all explained configurations. In addition, a part of the configuration of one embodiment can be added to the configuration of another embodiment. Moreover, the configuration of one embodiment can be also added to the configuration of another embodiment. Furthermore, adding, removing or replacement of another configuration can be possible relative to a part of the configuration of each of the embodiments.

As a connection terminal assembled body based on the embodiments explained above, for example, the following aspect can be considered.

In a connection terminal assembled body, in one aspect thereof, a unit connection terminal of a connection terminal assembled body formed of at least one unit connection terminal is formed of an adhesion section to be soldered onto a circuit board and extending in an longitudinal direction, a terminal section extending in a direction approximately orthogonal to the adhesion section extending in the longitudinal direction and to be connected to a counterpart-side circuit board, a bent section bent so as to connect the adhesion section and the terminal section, and of a suction member made of synthetic resin, fixed more to the terminal section side than the bent section and having a suction surface to be sucked by an automatic machine.

In a preferable aspect of the connection unit assembled body, the suction member is arranged in an area from an intermediate position between the distal end of the terminal section and the adhesion section to the bent section.

In another preferable aspect, in any of aspects of the connection terminal assembled body, a projection position where the center of gravity position of the entire unit connection terminal including the suction member is projected toward the adhesion section side is included in the adhesion range of the adhesion section.

In another preferable aspect, in any of aspects of the connection terminal assembled body, a width at an arbitrary position from the suction member to the adhesion section is longer than a width from the suction member to the terminal section of the unit connection terminal.

In another preferable aspect, in any of aspects of the connection terminal assembled body, each of a plurality of unit connection terminals of a connection terminal assembled body in which the unit connection terminals are connected is formed of an adhesion section to be soldered onto a circuit board and extending in a longitudinal direction, a terminal section extending in a direction approximately orthogonal to the adhesion section extending in the longitudinal direction and to be connected to a counterpart-side circuit board, and of a bent section bent so as to connect the adhesion section and the terminal section, and the terminal section side more than the bent section of each of the unit connection terminals is integrally connected by a connection-suction member made of synthetic resin. Moreover, a suction portion having a suction surface to be sucked by an automatic machine is formed at an approximately center of the connection-suction member.

In another preferable aspect, in any of aspects of the connection terminal assembled body, the connection-suction member is arranged in an area from an intermediate position between the distal end of the terminal section and the adhesion section to the bent section of each of the unit connection terminals.

In another preferable aspect, in any of aspects of the connection terminal assembled body, a projection position where the center of gravity position of the entire connection terminal assembled body including the connection-suction member is projected toward the adhesion section side is included in the adhesion range of the entire connection terminal assembled body.

In addition, as the circuit board accompanying the connection terminal assembled body based on the embodiments explained above, for example, the following aspect can be considered.

In the circuit board, in one aspect thereof, the connection terminal assembled body connecting the circuit board on which electric components are disposed and a counterpart-side circuit board is soldered with "reflowing process".

The invention claimed is:

1. A connection terminal assembled body, comprising:
at least one unit connection terminal,
wherein the unit connection terminal comprises:
an adhesion section to be soldered onto a circuit board and extending in a longitudinal direction;
a terminal section extending in a direction approximately orthogonal to the adhesion section extending in the longitudinal direction and to be connected to a counterpart-side circuit board;
a bent section bent from the terminal section in the longitudinal direction so as to connect the adhesion section and the terminal section; and a suction member made of synthetic resin, fixed more to a terminal section side than the bent section, and having a suction surface to be sucked by an automatic machine, and wherein the suction surface is located more on a bent section side than the terminal section.

2. The connection terminal assembled body according to claim 1, wherein the suction member is arranged in an area from an intermediate position between a distal end of the terminal section and the adhesion section to the bent section.

3. The connection terminal assembled body according to claim 2, wherein a projection position where a gravity center position of the entire unit connection terminal including the suction member is projected toward an adhesion section side is included in an adhesion range of the adhesion section.

4. The connection terminal assembled body according to claim 3, wherein a width at an arbitrary position from the suction member to the adhesion section of the unit connection terminal is longer than a width from the suction member to the terminal section of the unit connection terminal.

5. A circuit board, comprising:
a terminal assembled body,
wherein the terminal assembled body connecting the circuit board mounting an electrical component with a counterpart-side circuit board is soldered onto the circuit board by a reflowing process, and
wherein the terminal assembled body is a terminal assembled body according to claim 1.

6. A connection terminal assembled body comprising:
a plurality of unit connection terminals,
wherein each of the unit connection terminals comprises:
an adhesion section to be soldered onto a circuit board and extending in a longitudinal direction;
a terminal section extending in a direction approximately orthogonal to the adhesion section extending in the longitudinal direction and to be connected to a counterpart-side circuit board; and
a bent section bent from the terminal section in the longitudinal direction so as to connect the adhesion section and the terminal section,
wherein a terminal section side more than the bent section of each of the unit connection terminals is integrally connected by a connection-suction member made of synthetic resin, and
wherein a suction portion having a suction surface to be sucked by an automatic machine is formed at an approximately center of the connection-suction member, and
wherein the suction surface is located more on a bent section side than the terminal section.

7. The connection terminal assembled body according to claim 6, wherein the connection-suction member is arranged in an area from an intermediate position between a distal end of the terminal section and the adhesion section to the bent section of each of the unit connection terminals.

8. The connection terminal assembled body according to claim 7, wherein a projection position where a gravity center position of the entire connection terminal assembled body including the connection-suction member is projected toward an adhesion section side is included in an adhesion range of the entire connection terminal assembled body.

9. A circuit board, comprising:
a terminal assembled body,
wherein the terminal assembled body connecting the circuit board mounting an electrical component with a counterpart-side circuit board is soldered onto the circuit board by a reflowing process, and
wherein the terminal assembled body is a terminal assembled body according to claim 6.

* * * * *